(12) United States Patent
Reddy et al.

(10) Patent No.: US 6,356,110 B1
(45) Date of Patent: Mar. 12, 2002

(54) MULTIFUNCTION MEMORY ARRAY IN A PROGRAMMABLE LOGIC DEVICE

(75) Inventors: Srinivas T. Reddy, Fremont; Brian D. Johnson, Sunnyvale; Christopher F. Lane; Ketan H. Zaveri, both of San Jose, all of CA (US)

(73) Assignee: Altera Corporation San Jose CA

( * ) Notice: Subject to any disclaimer, the term of this patent is extended or adjusted under 35 U.S.C. 154(b) by 0 days.

(21) Appl. No.: 09/675,727

(22) Filed: Sep. 29, 2000

Related U.S. Application Data
(60) Provisional application No. 60/194,202, filed on Apr. 3, 2000.

(51) Int. Cl.[7] .................................................. H01L 25/01
(52) U.S. Cl. ............................... 326/41; 326/38; 326/39
(58) Field of Search ................................ 326/38, 39, 41

(56) References Cited

U.S. PATENT DOCUMENTS

| | | | |
|---|---|---|---|
| 5,212,652 A | 5/1993 | Agrawal et al. | 364/489 |
| 5,343,406 A | 8/1994 | Freeman et al. | 364/406 |
| 5,352,940 A | 10/1994 | Watson | 307/465 |
| 5,414,377 A | 5/1995 | Freidin | 326/41 |
| 5,432,719 A | 7/1995 | Freeman et al. | 364/579 |
| 5,488,316 A | 1/1996 | Freeman et al. | 326/41 |
| 5,550,782 A | 8/1996 | Cliff et al. | 365/230.03 |
| 5,566,123 A | 10/1996 | Freidin et al. | 365/230.05 |
| 5,572,148 A | 11/1996 | Lytle et al. | 326/41 |
| 5,631,577 A | 5/1997 | Freidin et al. | 326/40 |
| 5,648,732 A | 7/1997 | Duncan | 326/40 |
| 5,689,195 A | 11/1997 | Cliff et al. | 326/41 |
| 5,758,192 A | 5/1998 | Alfke | 395/877 |
| 5,889,413 A | 3/1999 | Bauer | 326/40 |
| 5,898,893 A | 4/1999 | Alfke | 395/877 |
| 5,926,036 A | 7/1999 | Cliff et al. | 326/40 |
| 5,933,023 A * | 8/1999 | Young | 326/40 |
| 6,049,223 A | 4/2000 | Lytle et al. | 326/40 |
| 6,215,326 B1 * | 4/2001 | Jefferson et al. | 326/41 |

OTHER PUBLICATIONS

U.S. application No. 09/007,718, Zaveri et al., filed Jan. 15, 1998, now patent No. 6,249,143, issued Jun. 2001.

U.S. application No. 09/266,235, Jefferson et al., filed Mar. 10, 1999, now patent No. 6,215,326, issued Apr. 2001.

P. Chow et al., "A 1.2 $\mu$m CMOS FPGA using Cascaded Logic Blocks and Segmented Routing", *FPGAs*, Chapter 3.2, pp. 91–102, W.R. Moore and W. Luk (eds.), Abingdon EE&CS Books, Abingdon (UK), 1991.

L. Mintzer, "FIR Filters with the Xilinx FPGA", FPGA '92 #129–#134.

"Optimized Reconfigurable Cell Array (ORCA) Series Field–Programmable Gate Arrays", Advance Data Sheet, AT&T Microelectronics, Feb. 1993, pp. 1–36 and 65–87.

*The Programmable Logic Data Book*, 1994, Xilinx, Inc., San Jose, CA, cover pages and pp. 2–5 through 2–102 ("XC4000 Logic Cell Array Families").

(List continued on next page.)

*Primary Examiner*—Michael Tokar
*Assistant Examiner*—Anh Q. Tran
(74) *Attorney, Agent, or Firm*—Fish & Neaves; Joo-Youn Park (57) ABSTRACT

A logic array block (LAB) that is programmably selectively configurable for use as a multifunction memory array is provided. The LAB is configurable for operation in at least two modes: in a first mode, each logic element within the LAB is individually configurable to perform logic functions; in a second mode, the logic elements are collectively usable as a multifunction memory array. The multifunction memory array may be addressed on a LAB-wide basis with separate read and write addresses, such that it may be configured to implement a variety of memory schemes, including first-in-first-out (FIFO) memory and random access memory (RAM).

15 Claims, 12 Drawing Sheets

OTHER PUBLICATIONS

B. Klein, "Use LFSRs to Build Fast FPGA–Based Counters", Electronic Design, Mar. 21, 1994, pp. 87, 88, 90, 94, 96, 97, and 100.

A. DeHon, "Reconfigurable Architectures for General–Purpose Computing", M.I.T. Ph.D. thesis, Sep. 1996.

R. Iwanczuk, "Using the XC4000 RAM Capability", XAPP 031.000, Xilinx, Inc., San Jose, CA.

J.R. Hauser et al., "Garp: A MIPS Processor with a Reconfigurable Coprocessor", 0–8186–8159–4/97 $10.00 © 1997 IEEE, pp. 12–21.

A. Ohta et al., "New FPGA Architecture for Bit–Serial Pipeline Datapath", 0–8186–8900–5/98 $10.00 © 1998 IEEE, pp. 58–67.

"XC4000E and XC4000X Series Field Programmable Gate Arrays: Product Specification", May 14, 1999 (Ver. 1.6), Xilinx, Inc., San Jose, CA, pp. 6–5 through 6–72.

"Flex 10K Embedded Programmable Logic Family", Data Sheet, Jun. 1999, ver. 4.01, Altera Corporation, San Jose, CA, pp. 1–137.

"Flex 10KE Embedded Programmable Logic Family", Data Sheet, Aug. 1999, ver. 2.02, Altera Corporation, San Jose, CA, pp. 1–120.

"XC4000XLA/XV Field Programmable Gate Arrays: Product Specification", DS015 (v1.3) Oct. 18, 1999, Xilinx, Inc., San Jose, CA, pp. 6–157 through 6–170.

"Triscend E5 Configurable System–on–Chip Family", Triscend Corporation, Jan. 2000 (Version 1.00) Product Description, cover page and pp. 25–28.

"Apex 20K Programmable Logic Device Family", Data Sheet, Mar. 2000, ver. 2.06, Altera Corporation, San Jose, CA, pp. 1–208.

"Virtex 2.5V Field Programmable Gate Arrays", DS003 (v.2.0), Preliminary Product Specification, Mar. 9, 2000, Xilinx, Inc., San Jose, CA, pp. 1–72.

"Virtex–E 1.8V Extended Memory Field Programmable Gate Arrays", DS025 (v1.0) Mar. 23, 2000, Advance Product Specification, Xilinx, Inc., San Jose, CA, pp. 1 and 6.

* cited by examiner

MULTIFUNCTION MEMORY ARRAY IN A PROGRAMMABLE LOGIC DEVICE

CROSS REFERENCE TO RELATED APPLICATION

This claims the benefit of United States Provisional Patent Application No. 60/194,202, filed Apr. 3, 2000.

BACKGROUND OF THE INVENTION

This invention relates to programmable logic devices, and more particularly to implementing memory structures within such devices.

Common architectural features of programmable logic devices include a two-dimensional array of rows and columns of logic array blocks (LABs) and a programmable network of interconnection conductors for conveying signals between the LABs. The design of programmable logic devices may be enhanced by the addition of large memory blocks (e.g., random access memory (RAM) or read-only memory (ROM)) between the LABs (see, for example, Cliff et al. U.S. Pat. No. 5,689,195, and Jefferson et al. U.S. patent application Ser. No. 09/266,235, filed Mar. 10, 1999).

These memory blocks are useful for storing large blocks of data and/or performing various logic functions that may be more efficiently performed in a single relatively large memory block rather than in several LABs. However, there are some applications in which using these memory blocks may not be an efficient use of system resources. When applications use only a fraction of the available capacity of these memory blocks, for example, the chip area and the interconnect resources allocated to these memory blocks are not being used efficiently.

SUMMARY OF THE INVENTION

The present invention relates to an improved LAB that allows a user to programmably selectively implement multifunction memory arrays on a programmable logic device. The improved LAB is programmably configurable for operation in at least two modes: in a first mode, the LAB is configured to perform logic functions; in a second mode, the LAB is usable as a multifunction memory array. In one embodiment, the multifunction memory array may be addressed on a LAB wide basis with separate read and write addresses such that it may be configured to implement a variety of memory schemes, including first-in-first-out (FIFO) memory and random access memory (RAM).

The improved LAB that is constructed in accordance with the principles of the present invention possesses several advantageous features over conventional LAB designs. For example, the improved LAB will allow a user to efficiently build modular memory structures in a programmable logic device by allowing the user to programmably configure, as necessary, only those LABs that need to be used as multifunction memory arrays.

Further features of the invention, its nature and various advantages will be more apparent from the accompanying drawings and the following detailed description of the invention.

BRIEF DESCRIPTION OF THE DRAWINGS

FIG. 1b is a simplified block diagram of an alternative embodiment of the programmable logic device of FIG. 1a.

DETAILED DESCRIPTION OF THE INVENTION

Figure 1A:
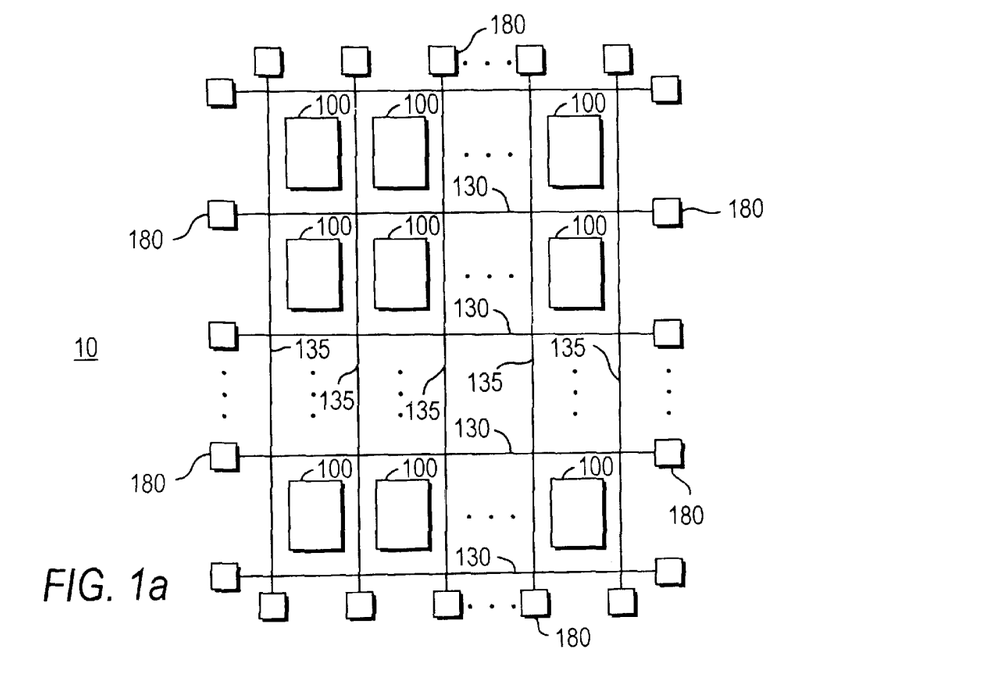
FIG. 1a is a simplified block diagram of an illustrative programmable logic device.

FIG. 1a is a simplified block diagram of an illustrative programmable logic device 10 which may be improved in accordance with the principles of the present invention. Device 10 includes a plurality of LABs 100, operatively disposed in a two-dimensional array of rows and columns, and a programmable network of horizontal 130 and vertical 135 interconnection conductors for conveying signals amongst the LABs 100 and various I/O structures 180.

Figure 1B:
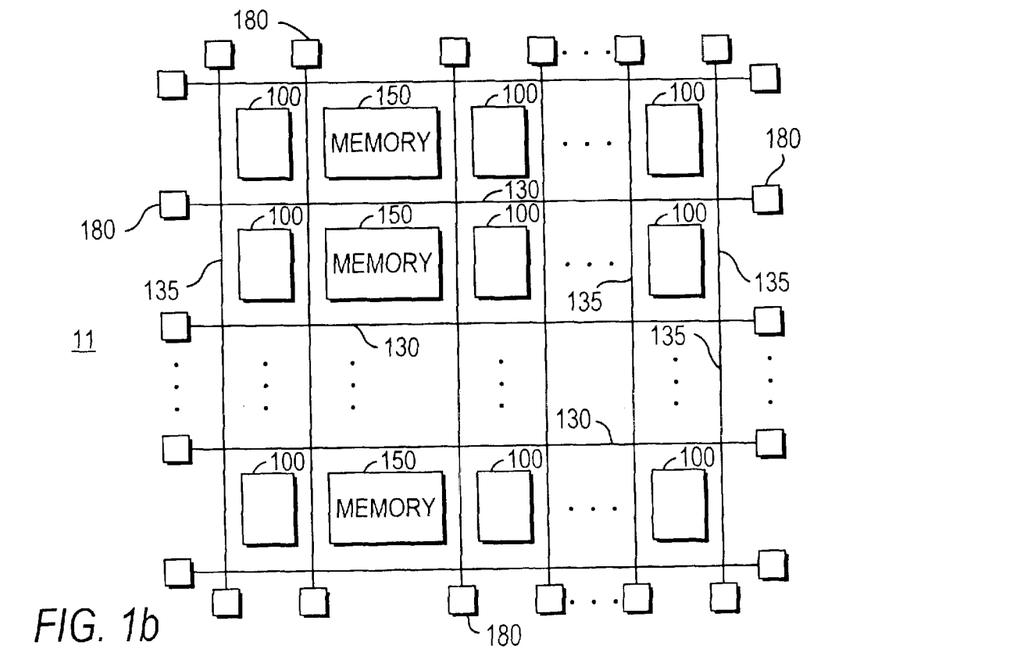

For applications in which the availability of a user-programmable block of programmable memory is a desirable feature, an alternative embodiment of device 10 is shown in FIG. 1b. FIG. 1b shows a programmable logic device 11 in which blocks of memory 150 are embedded in the two-dimensional array of LABs 100. Memory blocks 150 may be used to store data for use in performing logic functions that may be more efficiently performed in a single relatively large memory structure rather than in several LABs 100. In addition, memory blocks 150 may be configurable for a variety of uses, such as ROM, RAM, or FIFO memory.

Because memory blocks 150 are often designed to accommodate relatively large blocks of data, there are some applications in which using memory blocks 150 may not always be an efficient use of system resources: when applications require only a fraction of the available capacity of these memory blocks 150, for example, the chip area and the interconnect resources allocated to the memory blocks 150 are not being used efficiently.

The present invention seeks to improve the design of programmable logic devices by providing an improved LAB that can be programmably selectively converted into a multifunction memory array. In accordance with the principles of the present invention, the improved LAB will allow a user to efficiently build modular memory structures in a programmable logic device by allowing the user to programmably configure, as necessary, only those LABs that need to be used as multifunction memory arrays.

Figure 2:
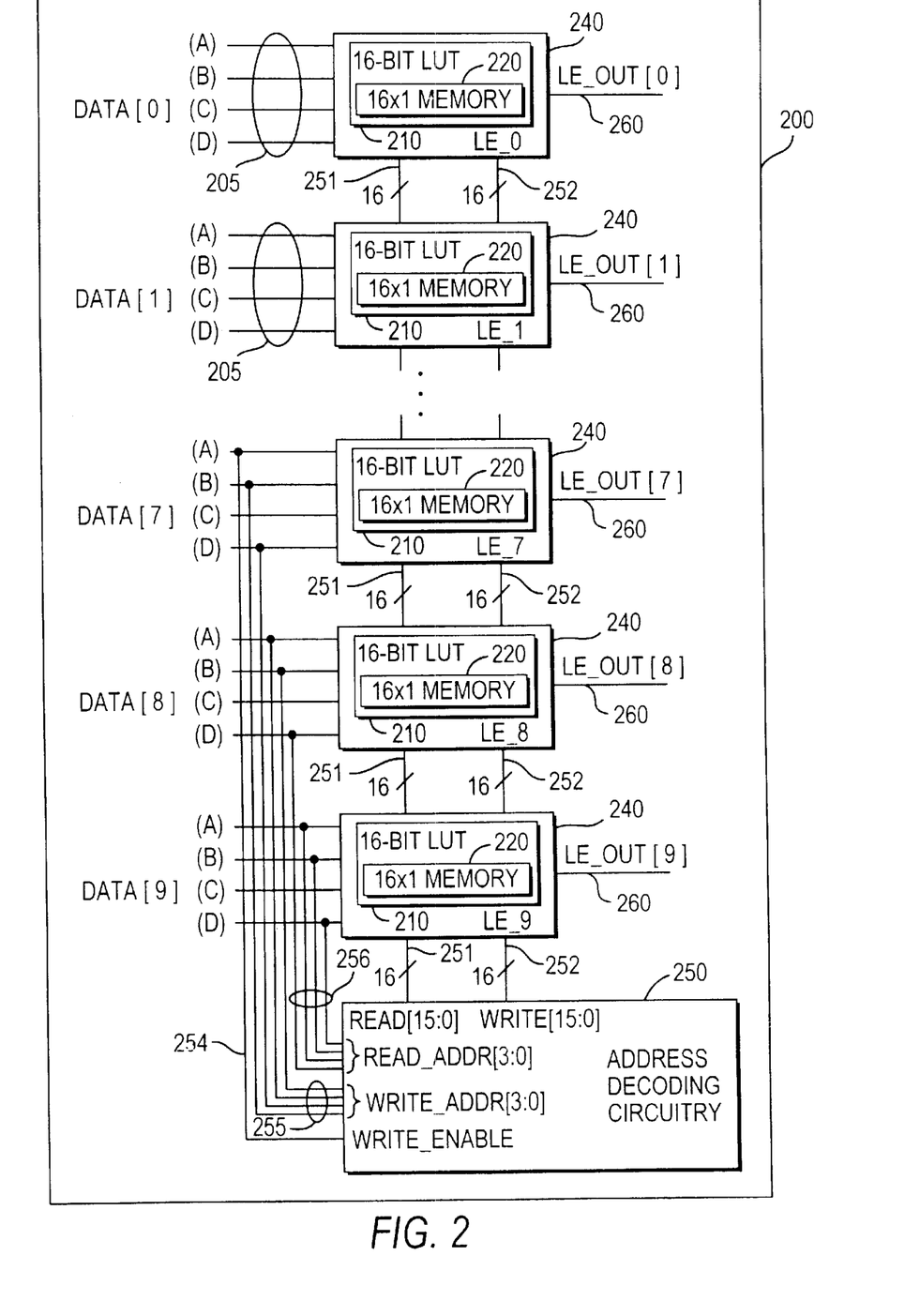
FIG. 2 is a simplified block diagram of a logic array block that may be constructed in accordance with the principles of the present invention.

FIG. 2 illustrates one embodiment of an improved LAB 200 that may be constructed in accordance with the principles of the present invention. LAB 200 includes a plurality of logic elements 240. For the purpose of illustration, there are ten logic elements 240 shown in FIG. 2; however, any number of logic elements 240 may be used. Each logic element 240 has a Look-Up-Table (LUT) 210 that includes an associated memory element 220, which, for the purpose of illustration, is shown as a 16×1 memory array for configuring 16-bit LUT 210. For accessing any one of sixteen memory locations within its associated memory element 220, each logic element 240 has four LUT input leads 205 for addressing LUT 210.

In accordance with the principles of the present invention, LAB 200 is programmably configurable for operation in at least two modes: logic mode and memory mode. In logic mode, logic elements 240 may be used to perform logic functions. In memory mode, the associated memory elements 220 within the logic elements 240 may be collectively usable as a multifunction memory array, in which the memory elements 220 are addressed with LAB-wide read and write addresses. For a LAB with M logic elements, each having a memory element with a storage capacity of N bits, the multifunction memory array that is created during memory mode may be up to N bits deep and up to M bits wide. By way of illustration, LAB 200 operated in memory mode could result in a multifunction memory array that is sixteen bits deep and ten bits wide, such that sixteen 10-bit words may be accommodated. Larger memory structures may be formed by combining multiple LABs 200 configured as multifunction memory arrays.

In one embodiment, the number of read and write addresses needed for the multifunction memory array implemented within LAB 200 corresponds to the number of memory locations within a single memory element 220. Since each memory element 220 within LAB 200 contains sixteen bit locations, a 4-bit read address and a 4-bit write address may be used. When these read and write addresses are applied LAB-wide, all the memory elements 220 that collectively form the multifunction memory array within LAB 200 are addressed with the same set of read and write addresses such that the same bit location within each 16-bit memory element 220 is addressed.

When operating LAB 200 as a multifunction memory array, the LUT input leads 205 of the logic elements 240 may be used for supplying data and address signals for the multifunction memory array. For the purpose of illustration, as shown in FIG. 2, one of the LUT input leads 205 (e.g., the (C) input) of each logic element 240 is used as the data input lead for the portion of the multifunction memory array implemented by its associated memory element 220. Likewise, a 4-bit LAB-wide read address READ_ADDR [3:0], a 4-bit LAB-wide write address WRITE_ADDR [3:0], and a 1-bit write enable signal WRITE_ENABLE may be supplied to LAB 200 via the (A), (B), and (D) inputs of the last three logic elements in LAB 200.

As shown in FIG. 2, LAB 200 includes address decoding circuitry 250 for decoding the READ_ADDR[3:0] and WRITE_ADDR[3:0] signals in order to assert one of sixteen READ and one of sixteen WRITE signals on leads 251 and 252, respectively. The arrangement shown in FIG. 2 for supplying and decoding the READ_ADDR[3:0], WRITE_ADDR[3:0], and WRITE_ENABLE signals is merely exemplary; other suitable arrangements may be used in accordance with the principles of the present invention.

Figure 3:
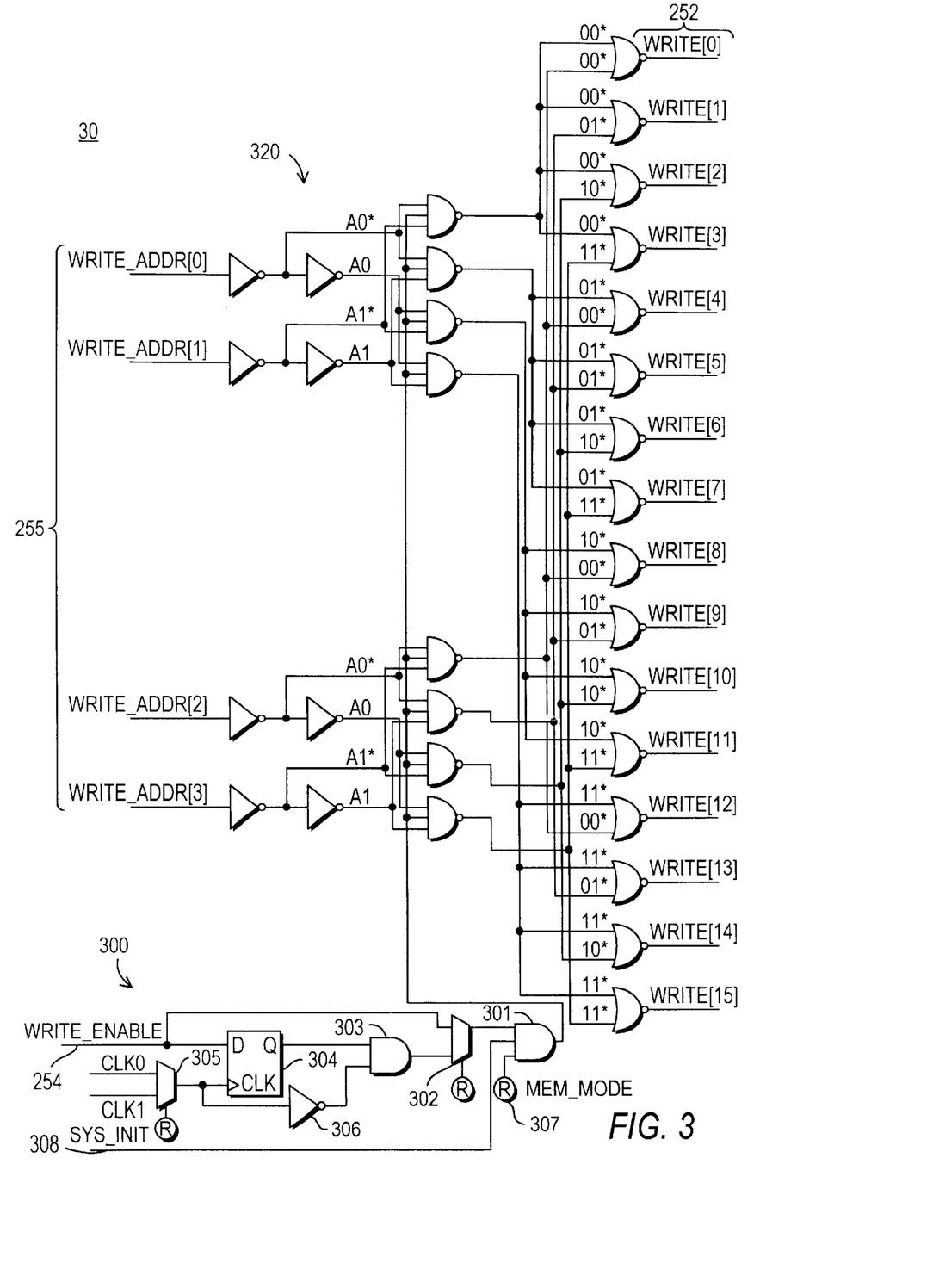
FIG. 3 is a simplified block diagram of a circuit which may be used in the logic array block of FIG. 2.

FIG. 3 shows one implementation of a write decoder 30 that may be included in address decoding circuitry 250. Write decoder 30 of FIG. 3 decodes the WRITE_ADDR signals on leads 255 and asserts one of sixteen WRITE signals on leads 252. Write decoder 30 includes a decoding matrix 320, which is representative of one embodiment which may be used. Other arrangements for decoding four bits into sixteen signals may be used in place of decoding matrix 320.

Write decoder 30 further includes a write control circuit 300 that may be responsive to a MEM_MODE bit provided via function control element (FCE) 307, represented as "®", which may be set when programming the device that includes LAB 200. The MEM_MODE bit is indicative of whether LAB 200 is to be operated in logic mode or in memory mode. For example, when MEM_MODE is logic LOW, write decoder 30 is disabled and LAB 200 may be operated in logic mode. Alternatively, when MEM_MODE is logic HIGH, write decoder 30 is operative and may be used to decode WRITE_ADDR[3:0] on leads 255, depending on the level of the WRITE_ENABLE signal on lead 254. When WRITE_ENABLE is logic LOW, none of the WRITE signals can be asserted. Conversely, when WRITE_ENABLE is logic HIGH, WRITE_ADDR[3:0] may be decoded to assert one of sixteen WRITE signals on leads 252. As shown in FIG. 3, the WRITE_ENABLE signal that is supplied to decoding matrix 320 may either be a synchronous or an asynchronous signal, depending on the configuration of programmable logic connector (PLC) 302. When PLC 302 is configured for synchronous operation, the WRITE_ENABLE signal is passed through a flip-flop 304 that may be clocked by any one of a plurality of clocks (e.g., CLK0, CLK1, etc.) that is selectable via PLC 305. When PLC 302 is configured for asynchronous operation, the WRITE_ENABLE signal on lead 254 bypasses the above-described flip-flop circuitry. Write control circuit 300 may also be responsive to a SYS_INIT signal on lead 308 which may be asserted to ensure that any residual and/or transient signals within write decoder 30 have settled prior to operation.

Figure 4:
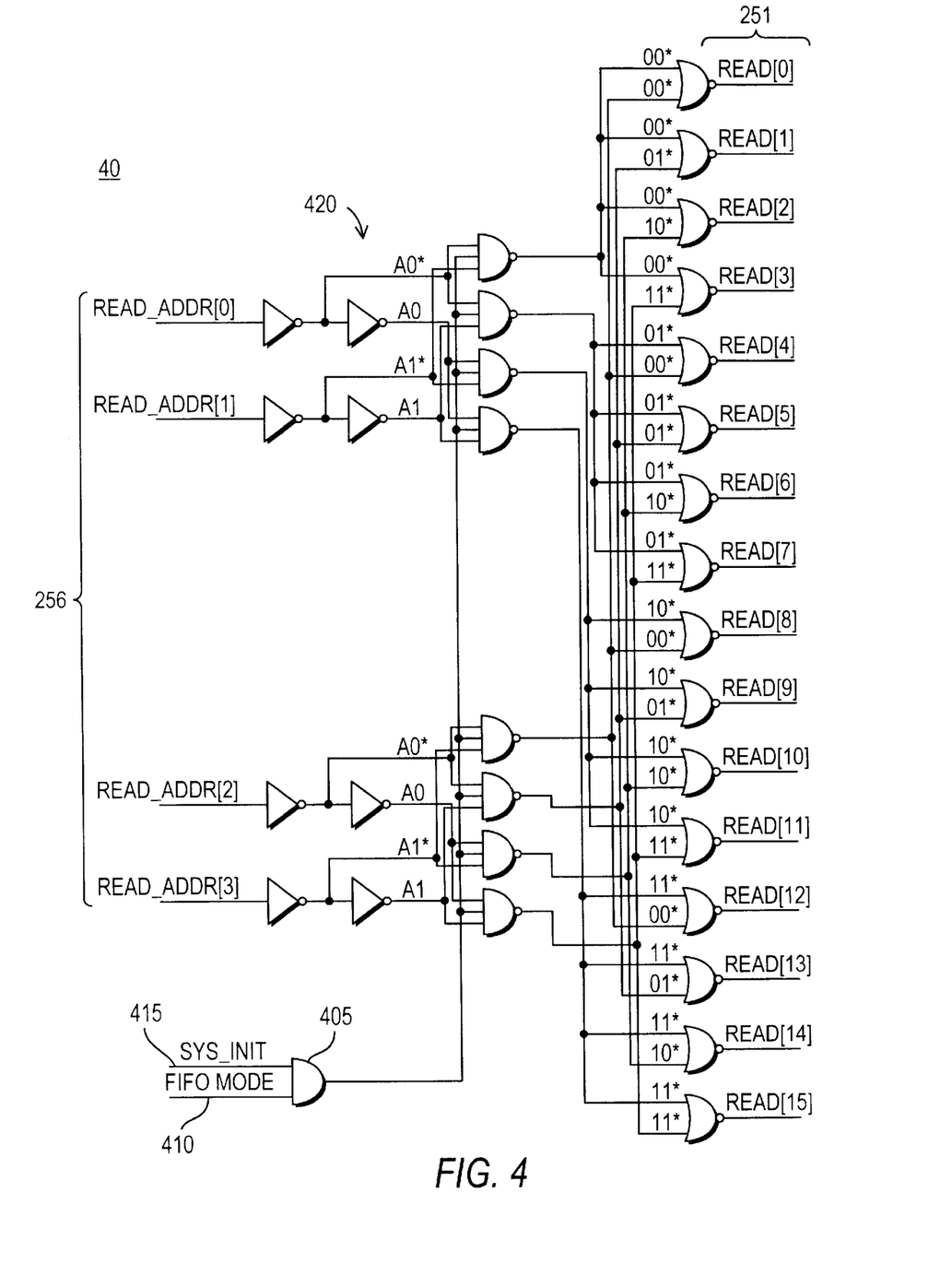
FIG. 4 is a simplified block diagram of another circuit which may be used in the logic array block of FIG. 2.

FIG. 4 shows one implementation of a read decoder 40 that may also be included in address decoding circuitry 250. Read decoder 40 decodes the READ_ADDR signals on leads 256 and asserts one of sixteen READ signals on leads 251. Read decoder 40 includes a decoding matrix 420, which is representative of one embodiment which may be used. Other arrangements for decoding four bits into sixteen signals may be used in place of decoding matrix 420. Read decoder 40 may be responsive a FIFO_MODE signal on lead 410 such that the multifunction memory array implemented in LAB 200 during memory mode may be configured for use as FIFO memory. As with write decoder 30, read decoder 40 may also be responsive to a SYS_INIT signal on lead 415.

Figure 5:
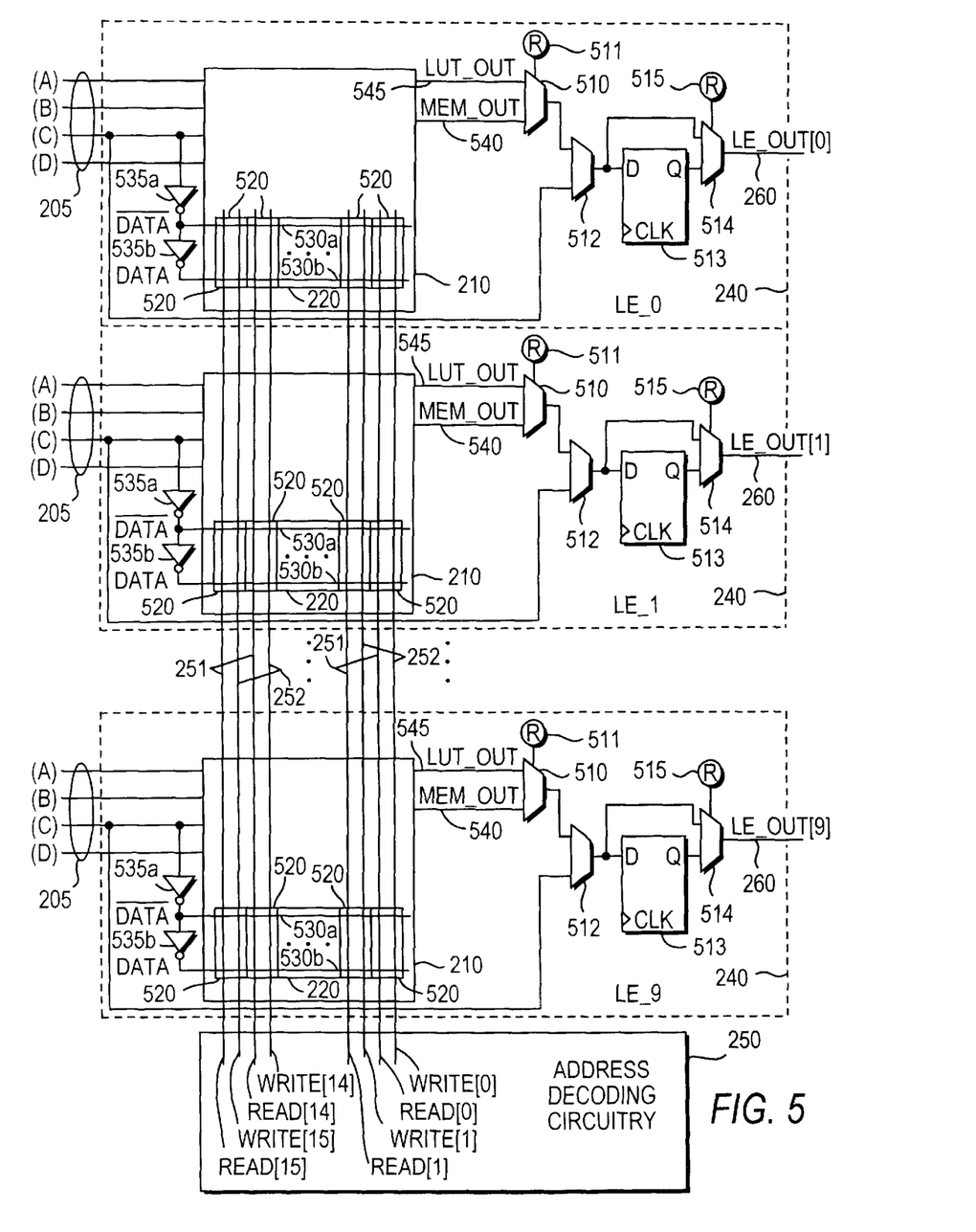
FIG. 5 shows the logic array block of FIG. 2 in greater detail.

FIG. 5 illustrates the LAB-wide addressing arrangement for the multifunction memory array implemented in LAB 200 in greater detail. As shown in FIG. 5, the memory elements 220 within LAB 200 share a set of read 251 and write 252 leads, which respectively carry the READ and WRITE signals generated by address decoding circuitry 250. Each read 251 and write 252 lead is connected to a respective one of the sixteen memory cells 520 within each 16×1 memory element 220, such that the same bit location within the associated memory element 220 of each logic element 240 is addressed in parallel. By way of illustration, when address decoding circuitry 250 addresses bit location 14 for reading by asserting READ[14] on lead 251, the contents of bit location 14 within each memory element 220 will be accessed. Similarly, when address decoding circuitry 250 addresses bit location 1 for writing by asserting WRITE [1] on lead 252, the information on data input lead (C) of each logic element 240 will be written via complementary data lines 530a/530b to bit location 1 within each memory element 220. In this manner, up to ten bits of data (e.g., a 10-bit word) may be read or written in parallel when LAB 200 is configured as a multifunction memory array. In the illustrative embodiment shown in FIG. 5, the maximum number of bits (e.g., width of a word) that may be read or written in parallel within LAB 200 corresponds to the number of logic elements 240 having memory elements 220. In accordance with the principles of the present invention, multiple LABs may be combined to form larger memory structures.

Because LAB 200 may be operated in either logic mode or memory mode, the output of LUT 210 within each logic element 240 is programmably configurable to output either a LUT output signal, LUT_OUT, on lead 545 during logic mode, or an alternate output signal, MEM_OUT, on lead 540 during memory mode. The MEM_OUT signal is generated by the respective portion of the multifunction memory array that is implemented by the associated memory element 220 within each logic element 240. A PLC 510 may be used to programmably select either LUT_OUT or MEM_OUT as the signal to be made available on logic element output lead 260. The output signal of PLC 510 may be made available on logic element output lead 260 as either a registered signal or a combinatorial signal, depending on the configuration of PLC 514.

Figure 6:
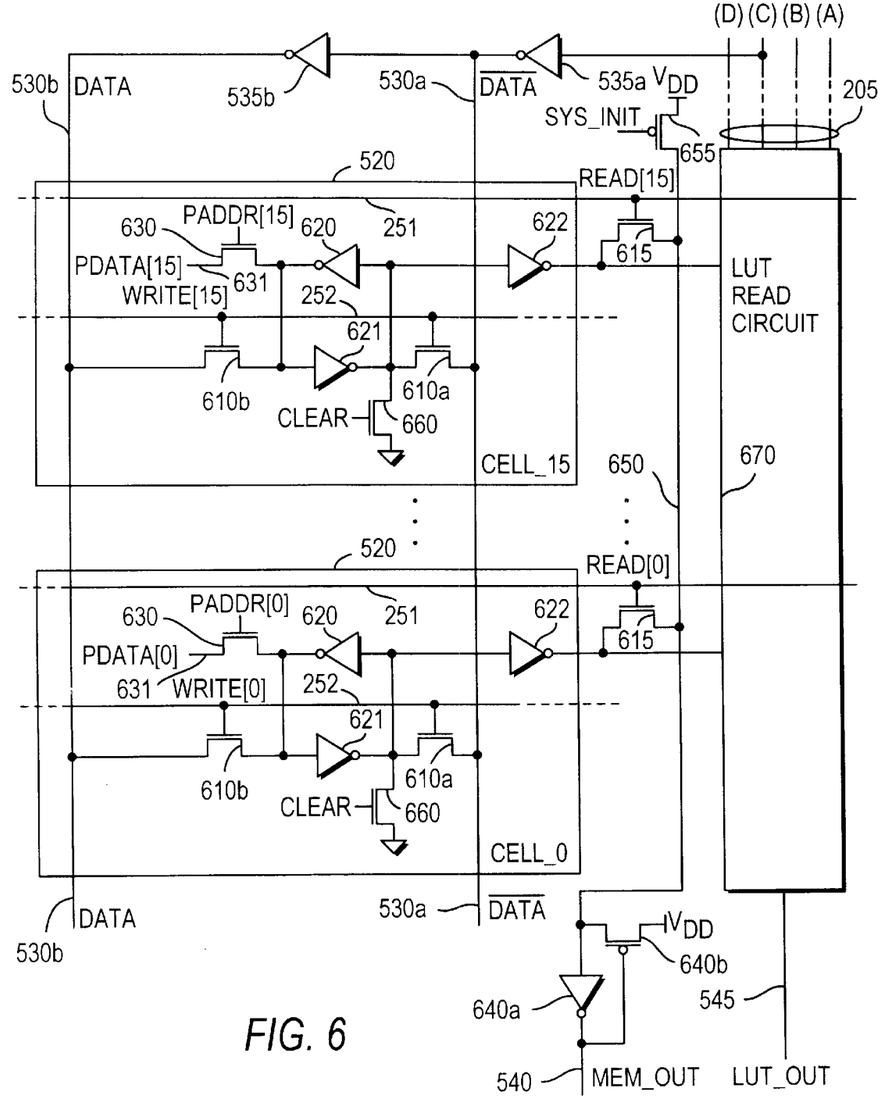
FIG. 6 shows a portion of the logic array block of FIG. 2 in greater detail.

FIG. 6 shows the 16-bit LUT 210 within each logic element 240 in greater detail. As shown in FIG. 6, LUT 210 within each logic element 240 includes a LUT read circuit 670 for reading data from its associated 16-bit memory element 220. LUT read circuit 670 may be implemented as a tree of multiplexers, but any conventional LUT read circuit may be used. As mentioned previously, the memory element 220 within LUT 210 includes sixteen memory cells 520 (designated as CELL_0 ... CELL_15) arranged in a 16×1 array. In each memory cell 520, a pair of inverters 620/621 performs the storage function. Memory cell 520 may include a pass transistor 660 that is responsive to a CLEAR signal such that the bit value stored in memory cell 520 may be cleared. For use when programming the device that includes LAB 200, each memory cell 520 may also have a pass transistor 630 through which LUT configuration data, PDATA, may be applied to the inverter pair 620/621 upon asserting PADDR.

When LAB 200 is operated as a multifunction memory array that is 16-bits deep, LUT read circuit 670 would not be used for accessing memory element 220 because one of the four LUT input leads 205 is being used as a data input. (An alternative embodiment in which the LUT read circuit may be used during memory mode will be discussed later.) In view of the limited functionality of LUT read circuit 670 during memory mode, LUT 210 may further include a read bus 650, on which the contents of each memory cell 520 may be applied via an addressable pass transistor 615 associated with each memory cell 520. The gate of each pass transistor 615 is connected to one of the READ signal leads 251. Upon assertion of its associated READ signal on lead 251, pass transistor 615 will apply on read bus 650 a bit value indicative of the contents stored in its associated memory cell 520. The complement of the bit value on read bus 650 is then made available on MEM_OUT lead 540 through an inverter 640a that may be coupled to a PMOS feedback transistor 640b, which is used to ensure that fully restored logic levels are available on MEM_OUT lead 540.

In order to write to memory cell 520 during memory mode, memory cell 520 further includes a pair of pass transistors 610a/b. Pass transistors 610a/b each have their gates connected to a WRITE signal lead 252 such that when the associated WRITE signal on lead 252 is asserted, the true and complementary versions of a bit value applied to the (C) LUT input lead 205 are applied to inverters 620/621 for storage via leads 530a/b and pass transistors 610a/b.

Figure 7:
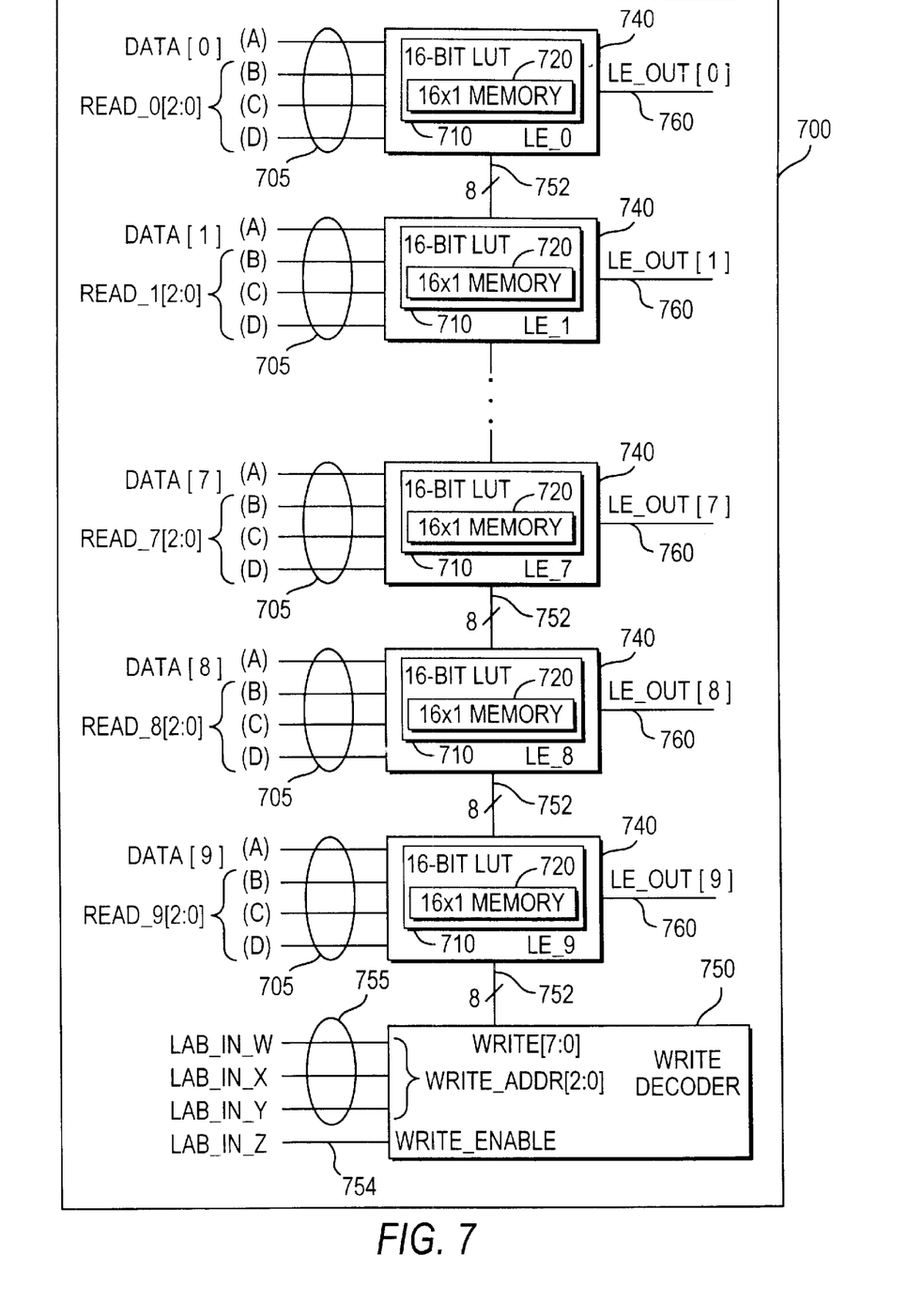
FIG. 7 is a simplified block diagram of an alternative logic array block that may be constructed in accordance with the principles of the present invention.

FIG. 7 shows an alternative embodiment of an improved LAB 700 that may be constructed in accordance with the principles of the present invention. As with LAB 200, LAB 700 may be operated in either logic mode, in which LAB 700 performs LUT-based logic functions, or in memory mode, in which LAB 700 functions as a multifunction memory array. Unlike LAB 200, however, LAB 700 does not require a separate read decoder (e.g., read decoder 40 shown in FIG. 4) for generating LAB-wide read signals for the multifunction memory array. Instead, the read addresses for the multifunction memory array implemented in LAB 700 are provided to each logic element 740 on its associated LUT input leads 705. As shown in FIG. 7, the (B), (C), and (D) LUT input leads 705 of each logic element 740 are used to provide a 3-bit read address for use during memory mode. The remaining (A) LUT input lead 705 is used as the data input when writing to the multifunction memory array. Because three of the four LUT input leads 705 of each logic element 740 are being used as address leads to access the associated memory element 720 within that logic element 740 during memory mode, the multifunction memory array that is implemented in LAB 700 will have a maximum effective depth of eight bits.

Figure 8:
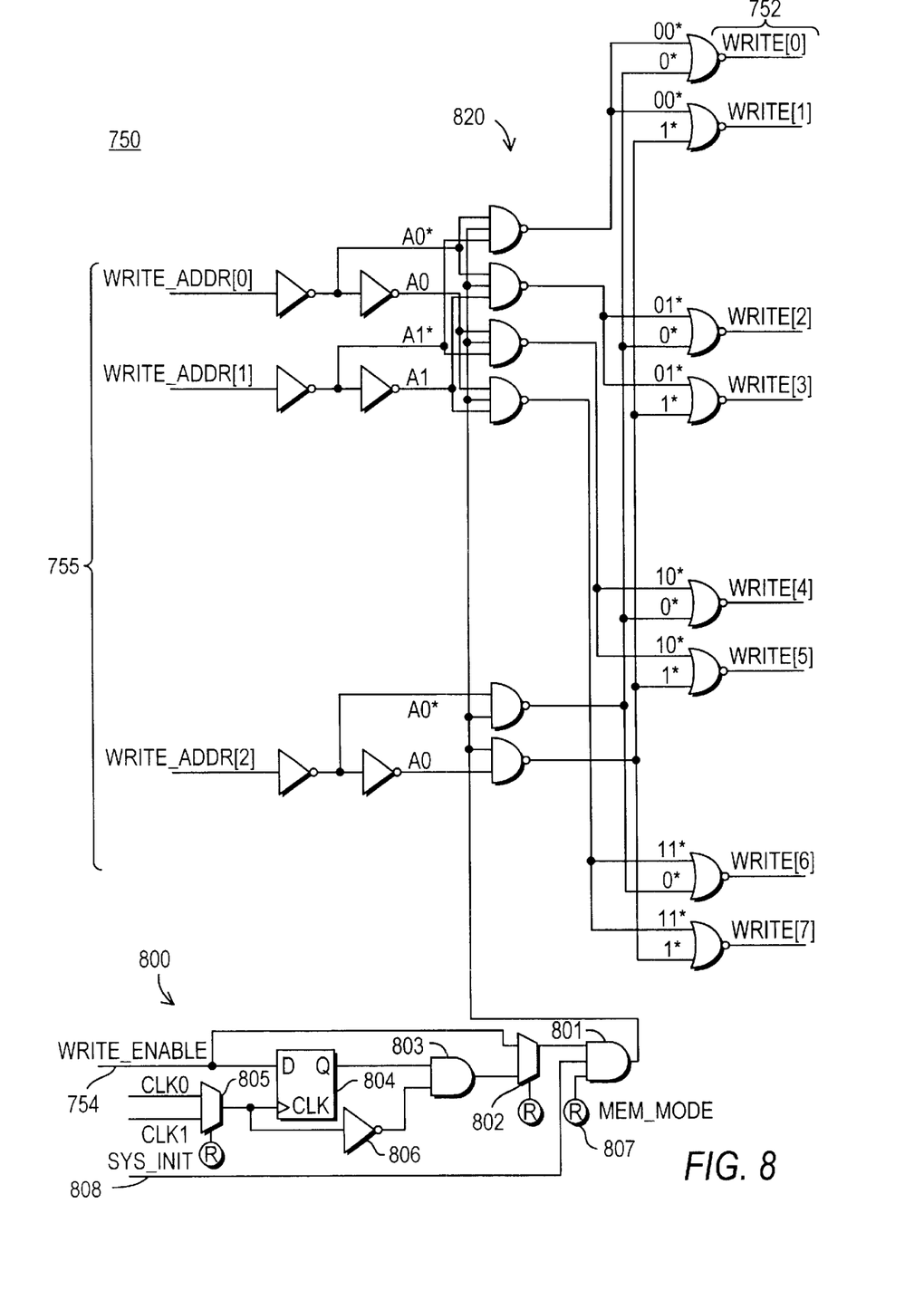
FIG. 8 is a simplified block diagram of a circuit which may be used in the logic array block of FIG. 7.

Because all four LUT input leads of each logic element 740 are used during memory mode, the write address and the WRITE_ENABLE signal for the multifunction memory array may be supplied to LAB 700 by using those inputs to LAB 700 that would be used for providing LAB-wide signals such as clocks and clears. These LAB-wide inputs, generically represented in FIG. 7 as LAB_IN_W, LAB_IN_X, LAB_IN_Y, and LAB_IN_Z, may be used to provide a LAB-wide write address, WRITE_ADDR[2:0], and a WRITE_ENABLE signal to a write decoder 750. Write decoder 750 decodes the 3-bit WRITE_ADDR[2:0] signal and asserts one of eight WRITE signals on leads 752. Write decoder 750 may be implemented by the circuit shown in FIG. 8, whose operation is similar to that of write decoder 30 illustrated in FIG. 3.

As in LAB 200, the multifunction memory array implemented in LAB 700 has separate read and write addresses, thereby making it possible to implement a variety of memory schemes, including FIFO memory and RAM. However, the effective depth of the multifunction memory array implemented in LAB 700 is half of that of the multifunction memory array implemented in LAB 200. While LAB 200 uses a read decoder 40 for decoding a 4-bit read address and associated read logic (e.g., pass transistors 615 and read bus 650) within each logic element 240 in order to access all sixteen bit locations within a given memory element 220, LAB 700 relies on the existing LUT read circuitry within each logic element 740 to read from its associated memory element 720 during memory mode. Because one of the LUT input leads is used for data, each LUT 710 is addressed by three of the four LUT inputs 705 during memory mode.

Accordingly, each memory element 720 has an effective storage capacity of eight bits instead of sixteen bits when LAB 700 is operated in memory mode.

Figure 9:
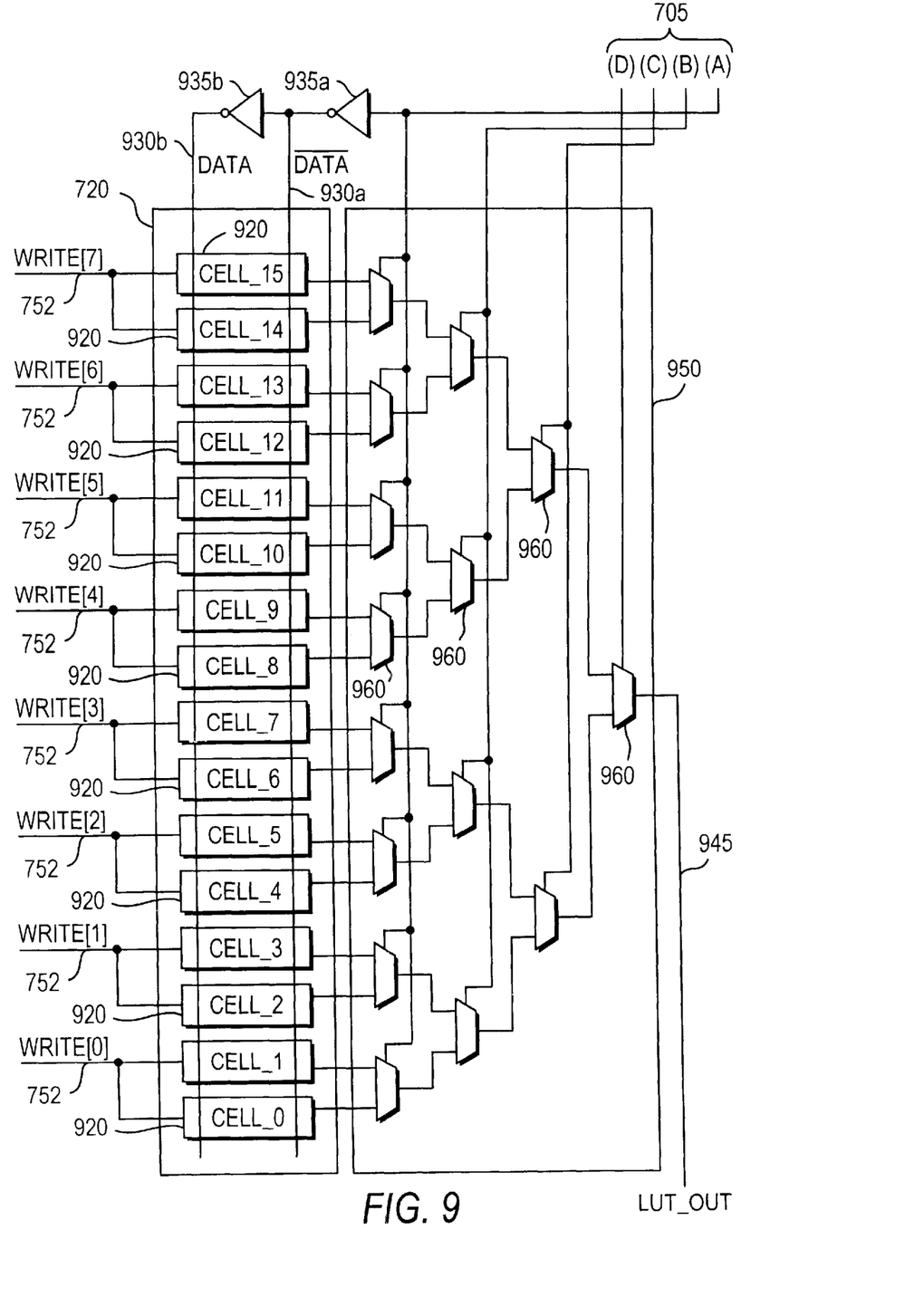
FIG. 9 shows a portion of the logic array block of FIG. 7 in greater detail.
Figure 10:
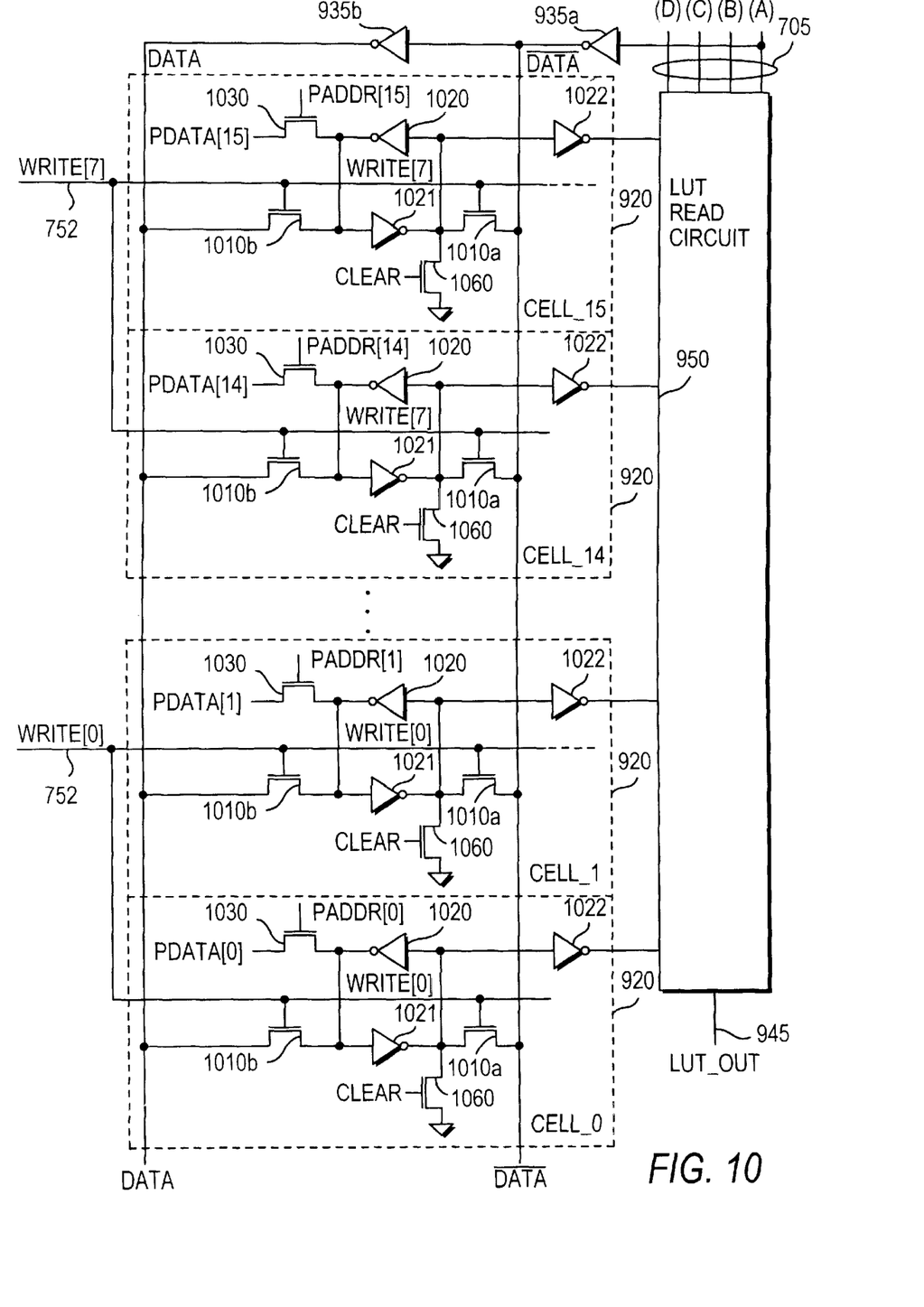
FIG. 10 shows an aspect of the portion shown in FIG. 9 in greater detail.

One arrangement for mapping eight effective bit locations into a 16×1 memory element 720 is shown in FIG. 9, which shows LUT 710 in greater detail. In addition to memory element 720, LUT 710 includes a LUT read circuit 950, which, for the purpose of illustration, is functionally represented as a tree of 2-input multiplexers 960. During logic mode, LUT read circuit 950 is used to read a bit value from one of the sixteen memory cells 920 within memory element 720, depending on the bit location specified by the signals applied on LUT input leads (A), (B), (C), and (D). During memory mode, however, LUT input lead (A) is not available for use as an address bit because it is used to provide data to memory element 720 via true and complementary bit lines 930a/b. Accordingly, the signal on LUT input lead (A) may be treated as a "don't care" bit by the LUT read circuit 950 during memory mode. This arrangement may be implemented by using LUT input lead (A) to supply the control signals for the 2-input multiplexers 960 that are each connected to two memory cells 920. In this arrangement, the signal on LUT input lead (A) will not be of any consequence in addressing bit locations in memory element 720 if each multiplexer 960 controlled by LUT input (A) is connected to a pair of memory cells 920 storing the same bit value. One possible arrangement for storing the same logic value in a pair of memory cells 920 involves writing to two memory cells 920 at a time. In this arrangement, which is shown in greater detail in FIG. 10, a pair of adjacent memory cells 920 shares a single WRITE signal on write lead 752. For example, the WRITE[7] signal on write lead 752 controls pass transistors 1010a/b in adjacent memory cells 920 designated CELL_15 and CELL_14.

Figure 11:
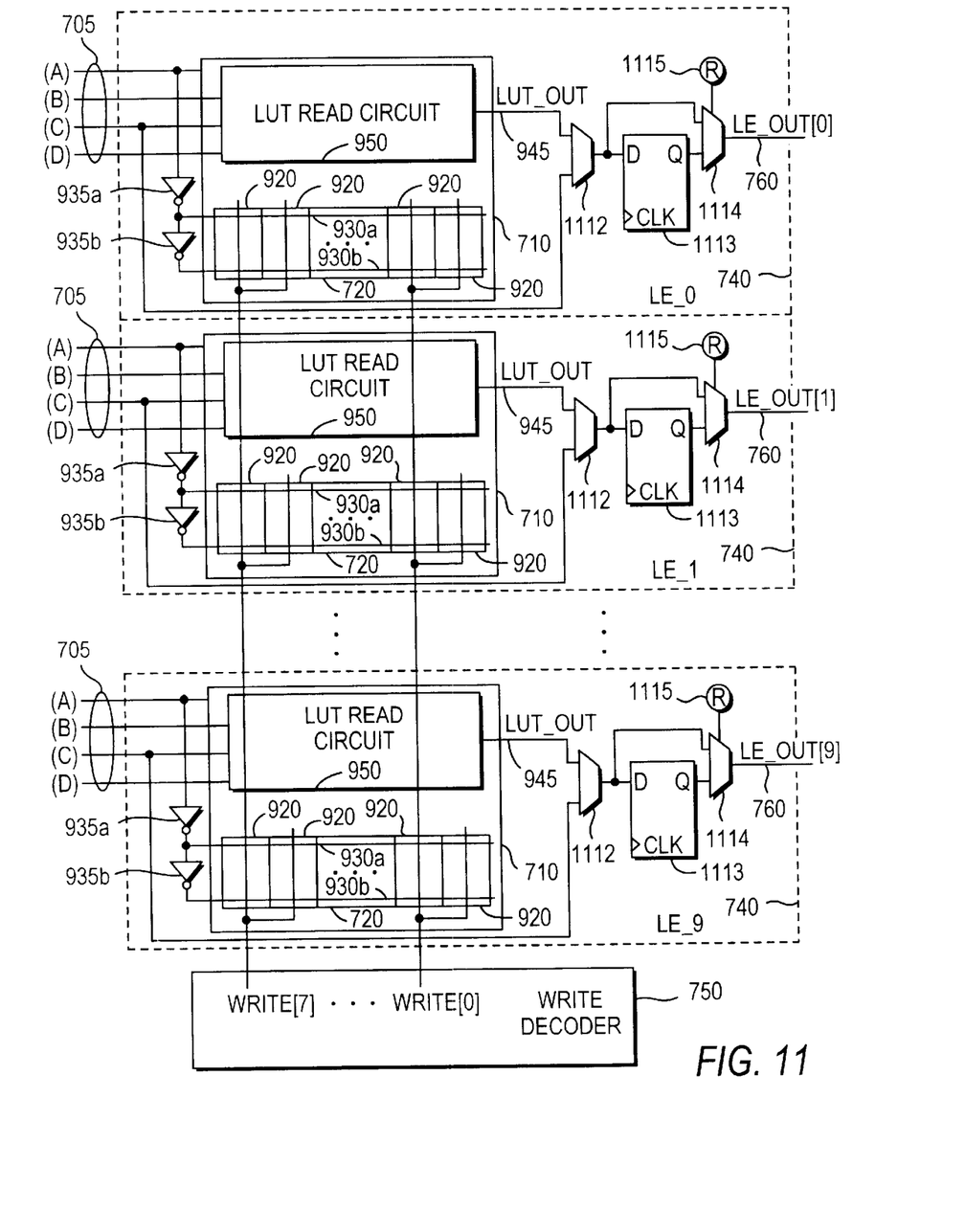
FIG. 11 shows the logic array block of FIG. 7 in greater detail.

FIG. 11 illustrates the overall addressing arrangement for the multifunction memory array that may be implemented within LAB 700 during memory mode. The read addresses, which are provided to each logic element 740 through its associated LUT input leads 705, may be LAB-wide signals that are applied to all the logic elements 740 such that the same bit location is addressed in each logic element 740. Alternatively, each logic element 740 may be supplied different read addresses for greater flexibility in addressing specific combinations of bit locations. In contrast to the read addresses, the write addresses are provided to a decoder circuit 750 that generates LAB-wide WRITE signals on write leads 752. As described previously, each write operation involves writing to two memory cells 920 at a time in each logic element 740. The multifunction memory array that is thus implemented within LAB 700 has a maximum width (e.g., word width) of ten bits and a maximum effective depth (e.g., number of words) of eight bits. Multiple LABs 700 may be combined to form larger memory structures.

Figure 12:
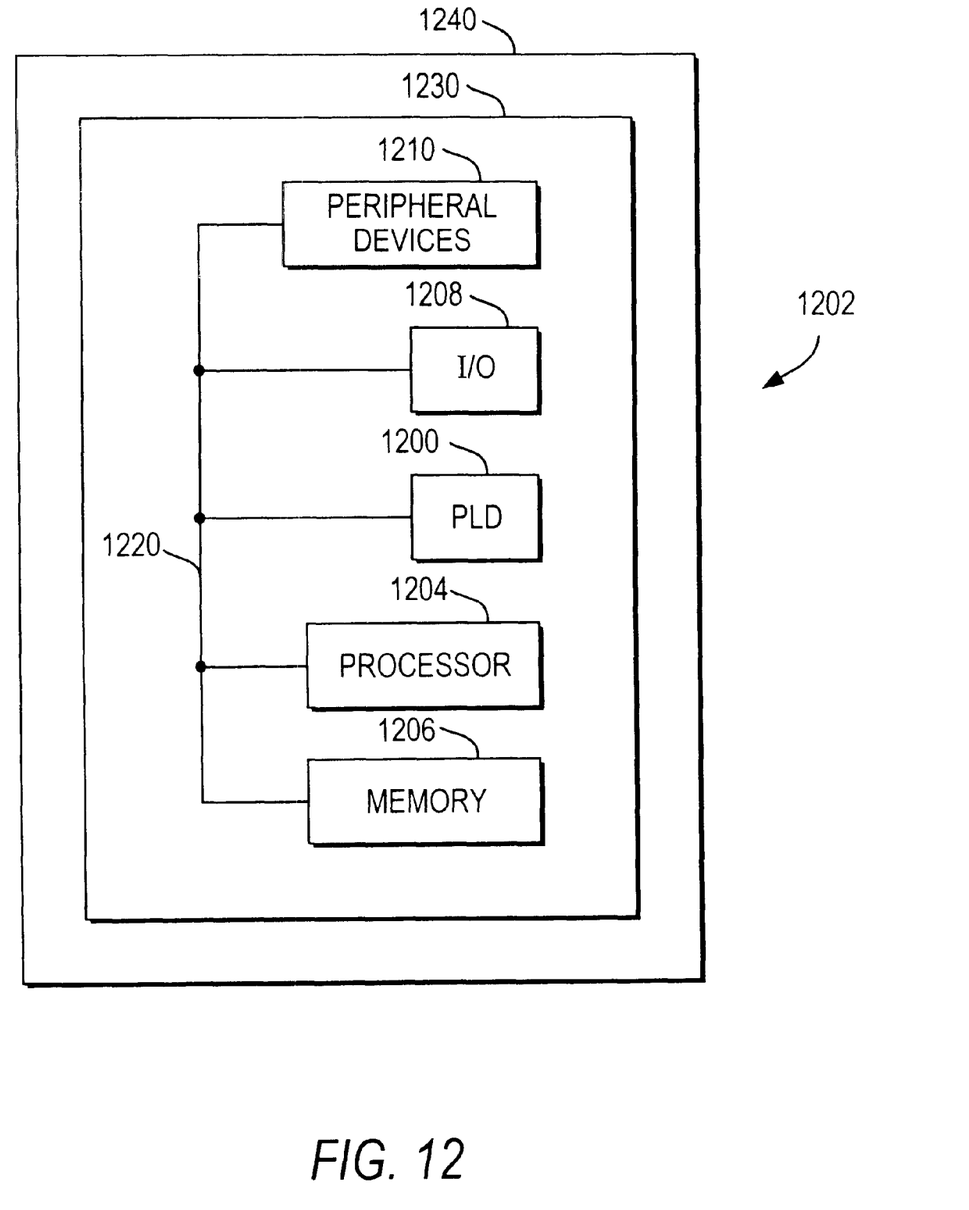
FIG. 12 is a simplified block diagram of an illustrative system incorporating a programmable logic device employing the logic array block of FIG. 2 and/or FIG. 7 in accordance with the principles of the invention.

FIG. 12 illustrates how a programmable logic device 1200 employing improved LAB 200 and/or 700 can be used in a data processing system 1202. Data processing system 1202 may include one or more of the following components: a processor 1204; memory 1206; I/O circuitry 1208; and peripheral devices 1210. These components are coupled together by a system bus 1220 and are populated on a circuit board 1230 which is contained in an end-user system 1240.

System 1202 can be used in a wide variety of applications, such as computer networking, data networking, instrumentation, video processing, digital signal processing, or any other application where the advantage of using programmable or reprogrammable logic is desirable. Programmable logic device 1200 can be used to perform a variety of different logic functions. For example, programmable logic device 1200 can be configured as a processor or controller that works in cooperation with processor 1204. Programmable logic device 1200 may also be used as an arbiter for arbitrating access to a shared resource in system 1202. In yet another example, programmable logic device 1200 can be configured as an interface between processor 1204 and one of the other components in system 1202. It should be noted that system 1202 is only exemplary, and that the true scope and spirit of the invention should be indicated by the following claims.

Various technologies can be used to implement the programmable logic devices of this invention, as well as the various components of those devices (e.g., the above-described PLCs and the FCEs which control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMS, EEPROMs, function control registers (e.g., as in Wahlstrom U.S. Pat. No. 3,473,160), ferroelectric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of logic units at each of the various levels in the hierarchy of logic units can differ from the specific examples mentioned herein. Similarly, the numbers of the various types of interconnection conductors and other elements can deviate from the specific examples mentioned herein. Different types and sizes of logic and memory units can be used if desired. It will also be understood that terms like "row" and "column", "horizontal" and "vertical", "left" and "right", "top" and "bottom", and other directional or orientational terms are used herein only for convenience, and that no fixed or absolute orientations are intended by the use of these terms. For example, the words in each of the word pairs mentioned above can be reversed if desired.

The invention claimed is:

1. A logic array block, comprising:
   a plurality of logic elements each having a plurality of logic element input leads and a memory element including a plurality of memory cells, each memory cell having addressable write circuitry for writing a bit value to be stored in that memory cell, wherein each logic element is individually configurable to perform any of a plurality of logic functions on a plurality of logic signals applied on its associated logic element input leads; and
   an address decoder circuit having a plurality of write address leads and a plurality of write control signal leads, wherein the address decoder circuit is configured to decode a set of write address signals applied on the write address leads to generate one of a plurality of write control signals that is conveyed on one of the plurality of write control signal leads to control the associated addressable write circuitry of at least one memory cell within the associated memory element of each logic element in the logic array block.

2. The logic array block defined in claim 1, wherein:

each memory cell has addressable read circuitry for reading a bit value that is stored in that memory cell; and the address decoder circuit has a plurality of read address leads and a plurality of read control signal leads, wherein the address decoder circuit is configured to decode a set of read address signals applied on the read address leads to generate one of a plurality of read control signals that is conveyed on one of the plurality of read control signal leads to control the associated addressable read circuitry of at least one memory cell within the associated memory element of each logic element in the logic array block.

3. The logic array block defined in claim 2, wherein the set of write address signals and the set of read address signals are applied to a subplurality of the logic element input leads of a subplurality of the logic elements within the logic array block, wherein the plurality of write address leads and the plurality of read address leads are connected between the subplurality of the logic element input leads and the address decoder circuit in providing the set of write address signals and the set of read address signals to the address decoder circuit.

4. The logic array block defined in claim 3, wherein each memory cell within each logic element is associated with a respective one of the write control signal leads and with a respective one of the read control signal leads.

5. The logic array block defined in claim 1, wherein the logic array block is operable in at least two modes, wherein in a first mode, each logic element is individually configurable to perform any of a plurality of logic functions on a plurality of logic signals applied on its associated logic element input leads, and wherein in a second mode, the associated memory elements within each logic element are collectively usable as a memory array that is collectively addressable for writing by the address decoder circuit.

6. The logic array block defined in claim 5, wherein in the second mode, the memory array is addressable for reading by a subplurality of the logic element input leads of each logic element within the logic array block.

7. The logic array block defined in claim 6, wherein the memory array has a maximum depth that corresponds to half of the number of memory cells within a given memory element and a maximum width that corresponds to the number of logic elements included in the logic array block.

8. The logic array block defined in claim 1, wherein the address decoder circuit includes write enable circuitry having a write enable input lead on which a write enable input signal is applied and a write enable output lead on which a write enable output signal is applied, wherein the address decoder circuit is responsive to the write enable output signal in decoding the set of write address signals.

9. The logic array block defined in claim 8, wherein the write enable circuitry is programmably configurable to generate a synchronous write enable output signal and an asynchronous write enable output signal, wherein the write enable circuitry further includes a programmable logic connector configured to programmably selectively apply either the synchronous write enable output signal or the asynchronous write enable output signal on the write enable output lead.

10. The logic array block defined in claim 9, wherein the write enable circuitry further includes register circuitry for generating the synchronous write enable output signal, wherein the register circuitry has associated clock selection circuitry configured to programmably selectively apply any one of a plurality of clock signals to the register circuitry.

11. A programmable logic device including the logic array block defined in claim 1.

12. A digital processing system comprising:

processing circuitry;

a memory coupled to the processing circuitry; and a programmable logic device as defined in claim 11 coupled to the processing circuitry and the memory.

13. A printed circuit board on which is mounted a programmable logic device as defined in claim 11.

14. The printed circuit board defined in claim 13 further comprising:

a memory mounted on the printed circuit board and coupled to the programmable logic device.

15. The printed circuit board defined in claim 14 further comprising:

processing circuitry mounted on the printed circuit board and coupled to the programmable logic device.

* * * * *